(12) United States Patent
Van Noort et al.

(10) Patent No.: US 9,331,086 B2
(45) Date of Patent: May 3, 2016

(54) INTEGRATED CIRCUIT WITH TRIMMING

(75) Inventors: Wibo D. Van Noort, Westbrook, ME (US); Theodore J. Letavic, Putnam Valley, NY (US); Francis Zaato, Fishkill, NY (US)

(73) Assignee: NXP B.V., Eindhoven (NL)

( * ) Notice: Subject to any disclaimer, the term of this patent is extended or adjusted under 35 U.S.C. 154(b) by 795 days.

(21) Appl. No.: 13/055,211

(22) PCT Filed: Jul. 14, 2009

(86) PCT No.: PCT/IB2009/053050
§ 371 (c)(1),
(2), (4) Date: Apr. 15, 2011

(87) PCT Pub. No.: WO2010/010482
PCT Pub. Date: Jan. 28, 2010

(65) Prior Publication Data
US 2011/0186919 A1    Aug. 4, 2011

(30) Foreign Application Priority Data
Jul. 23, 2008    (EP) .................................... 08160979

(51) Int. Cl.
*G11C 29/02*    (2006.01)
*H01L 27/115*    (2006.01)
(Continued)

(52) U.S. Cl.
CPC .......... *H01L 27/115* (2013.01); *G11C 16/0416* (2013.01); *G11C 27/005* (2013.01); *H01L 27/105* (2013.01); *H01L 27/1026* (2013.01); *H01L 27/11517* (2013.01); *H01L 29/792* (2013.01); *H03K 5/133* (2013.01); *H03M 1/802* (2013.01); *G11C 2216/10* (2013.01); *H01L 21/8249* (2013.01); *H03K 2005/00019* (2013.01)

(58) Field of Classification Search
CPC ..................................................... G11C 29/028
USPC .................... 365/185.05, 149, 185.01–185.28
See application file for complete search history.

(56) References Cited

U.S. PATENT DOCUMENTS 6,617,637 B1 *   9/2003   Hsu et al. ....................... 257/315
6,728,133 B2 *   4/2004   Shimizu .................... 365/185.03
(Continued)

FOREIGN PATENT DOCUMENTS

WO    2004/034404 A2    4/2004

OTHER PUBLICATIONS

Carley, L.R.; , "Trimming analog circuits using floating-gate analog MOS memory," Solid-State Circuits Conference, 1989. Digest of Technical Papers. 36th ISSCC., 1989 IEEE International , vol., No., pp. 202-203, Feb. 15-17, 1989.*

(Continued)

*Primary Examiner* — Khamdan Alrobaie

(57) ABSTRACT

An integrated circuit is provided, which comprises at least one first group each having at least one analog unit; and at least one second group each having at least one electronically settable semi-permanent switching unit coupled to the at least analog unit of the first group for trimming the first group and having at least one many-times-programmable and non-volatile cell (MTP). Each many-times-programmable cell (MTP) comprises at least one MOS transistor having a floating gate (FG) with a tunnel oxide (TO) and a first capacitor coupled to the floating gate (FG). The capacitance of the first capacitor is substantially larger than a gate-channel capacitance of the MOS transistor.

16 Claims, 3 Drawing Sheets

(51) Int. Cl.
  *G11C 16/04* (2006.01)
  *G11C 27/00* (2006.01)
  *H01L 27/102* (2006.01)
  *H01L 27/105* (2006.01)
  *H01L 29/792* (2006.01)
  *H03K 5/13* (2014.01)
  *H03M 1/80* (2006.01)
  *H01L 21/8249* (2006.01)
  *H03K 5/00* (2006.01)

(56) References Cited

U.S. PATENT DOCUMENTS

| | | | |
|---|---|---|---|
| 7,196,950 B2* | 3/2007 | Kanda et al. | 365/194 |
| 2003/0081455 A1* | 5/2003 | Killat | 365/185.01 |
| 2003/0147277 A1* | 8/2003 | Hsu | 365/185.01 |
| 2003/0183871 A1 | 10/2003 | Dugger et al. | |
| 2004/0052113 A1* | 3/2004 | Diorio et al. | 365/185.21 |
| 2004/0135197 A1* | 7/2004 | Ausserlechner | 257/316 |
| 2005/0140449 A1 | 6/2005 | Diorio et al. | |
| 2006/0044861 A1* | 3/2006 | Smith et al. | 365/94 |
| 2009/0244971 A1* | 10/2009 | Lee et al. | 365/185.08 |

OTHER PUBLICATIONS

Trimmer (electronic) by Wikipedia which can be found at http://en.wikipedia.org/wiki/Trimmer_(electronics).*

Özalevli, Erhan "Exploiting floating-gate transistor properties in analog and mixed-signal circuit design"; Georgia Institute of Technology School of Electrical and Computer Engineering; 139 pages; (Dec. 2006).

Srinivasan, Venkatesh; "Programmable analog techniques for precision analog circuits, low power signal processing and on-chip learning", Georgia Institute of Technology School of Electrical and Computer Engineering; 182 pages (Aug. 2006).

Jackson, Scott, et al., "A Programmable Current Mirror for Analog Trimming Using Single-Poly Floating-Gate Devices in Standard CMOS Technology", IEEE Transactions on Circuits and Systems-II: Analog and Digital Signal Processing, vol. 48, No. 1; pp. 100-102 (Jan. 2001).

Chien, George; "A floating gate programmable MOSFET using standard double-poly CMOS process", University of California, Berkley, California; 4 pages (1999).

International Search Report and Written Opinion for application PCT/IB2009/053050 (Apr. 1, 2010).

* cited by examiner

INTEGRATED CIRCUIT WITH TRIMMING

FIELD OF THE INVENTION

The present invention relates to an integrated circuit.

BACKGROUND OF THE INVENTION

In the area of application-specific analog integrated circuits a tight control of the parameters of the IC manufacturing process maybe required. In some cases the accuracy requirements may exceed the process specifications or process capability. One way to deal with these problems is to implement some form of flexibility in the circuitry. A well-known example is the voltage-controlled oscillator. Here, a variable capacitor is used to enable a small variation in the oscillation frequency due to a variation in the control voltage. Similar principles can be applied to all other analog components such as filters, impedance matching networks amplifiers and the like.

All of these implementations however must rely on active circuitry (e.g. an accurate voltage source connected to a variable capacitor) that in-turn may only have a limited accuracy, reproducibility and supply-rejection. Often an accurate component that is independent of active circuitry is preferable, which must be trimmed to achieve the required accuracy.

For example, this is common practice in fabrication of Bulk-acoustic-wave filters and high-accuracy resistor in calibration standards. The trimming of the individual circuits can be performed with various techniques such as laser trimming, ion milling, ultrasonic cutters, customized masks, etc. However, all of these techniques are expensive due to the fact that they require specialized equipment and a complex mix of fabrication steps (the physical trimming process) and verification steps (electrical measurements). Moreover, they require a physical access to the die which makes a trimming after packaging rather difficult.

WO 04034404 discloses the use of a single-gate poly floating arrangement for trimming an analog circuit.

SUMMARY OF THE INVENTION

It is therefore an object to the invention to provide an integrated circuit with a reversible trimming capability.

This object is solved by an integrated circuit according to claim 1.

Therefore an integrated circuit is provided at least one first group each having at least one analog unit; and at least one second group each having at least one electronically settable semi-permanent switching unit coupled to the at least analog unit of the first group for trimming the first group and having at least one many-times-programmable (MTP) non-volatile memory element. Each many-times-programmable cell MTP comprises at least one MOS transistor having a floating gate FG with a tunnel oxide TO and a first capacitor coupled to the floating gate FG. The capacitance of the first capacitor is substantially larger than a gate-channel capacitance of the MOS transistor. Accordingly, the first capacitor is used to pull the potential of the floating gate. The two capacitors are coupled in series, i.e. a voltage division between the two capacitors will be present. The voltage will be divided according to the ratio of the two capacitors. Hence, most of the voltage will drop over from the gate to the body, i.e. the highest fraction of the voltage will be applied over the tunnel oxide. This is an effective way to induce a tunneling current through the TO that charges or discharges the floating gate, i.e. program or erase the memory element.

The invention relates to the idea to perform the trimming completely in the electrical domain and in a reversible way by using an MTP (many times programmable) cell as a semi-permanent (analog) switch. Hence, an analog IC or passive integration IC with one or more non-volatile memory MTP cell(s) used as a semi-permanent switch connecting analog components (e.g. capacitor, resistor, inductor) is provided. The setting of the switches is performed electronically (i.e. measure and determine switch positions (e.g., as in block 205 in FIG. 2), and program switch positions electronically) either at wafer-level test, final test or in the field (i.e. embedded in the final application) by programming the cells by means of programming voltages. The switches may retain their position by storing electric charge on a "floating-gate" e.g. implemented as an MTP cell. The charge is stored for the duration of the product lifetime (e.g. 10 years) and does not rely on any voltage supply being present (i.e. it is non-volatile).

The principles of the invention are advantageous as the yield can be increased due to an increased parametric accuracy and cost related to upgrading manufacturing equipment for the sole reason of increased accuracy can be avoided. Different versions can be consolidated into a single product that is tailored in the final stages of production by trimming the circuits thus simplifying the supply chain, and reducing the qualification effort. Electrical trimming of circuits can be performed at final test to correct inaccuracies in packaging and all prior manufacturing. Most other trimming methods require physical access to the silicon die. The trimming is reversible to allow re-calibration or adjustments in the field and adaptation to unanticipated new applications of the product. The product can even be trimmed after the packaged die is mounted on the circuit board. Many-time-programmable cells MTP are non-destructive; and the material integrity is maintained over large number of read/write cycles. Destructive methods introduce inherent uncertainty with respect to the product quality and reliability. Reverse engineering is much more difficult on MTP than physical trimmings. This makes the MTP product more resistant to copying or tampering. Non-volatile trimming is completely transparent to the end user; no special interface or procedure is required after final test. Once programmed, no more power is needed to sustain the calibrated state, this is an advantage over conventional varactor-based approach where a supply voltage is needed and inevitably power is dissipated and susceptibility to cross-talk is increased. The variable component is not connected to a power supply, hence it inherently has a very high supply rejection. Here, the MTP concept is used in a switch that connects analog elements e.g. in a high-frequency circuit.

It should be noted that according to ht invention existing features that can be found in CMOS, power management and BiCMOS technologies are used such that no specific manufacturing requirement are present. The non-volatile functionality is added without increasing the manufacturing complexity.

Further aspects of the invention are defined in the dependent claims.

BRIEF DESCRIPTION OF THE DRAWINGS

Embodiments and advantages of the present invention will now be described with reference to the Figures.

DETAILED DESCRIPTION OF EMBODIMENTS

Figure 1:
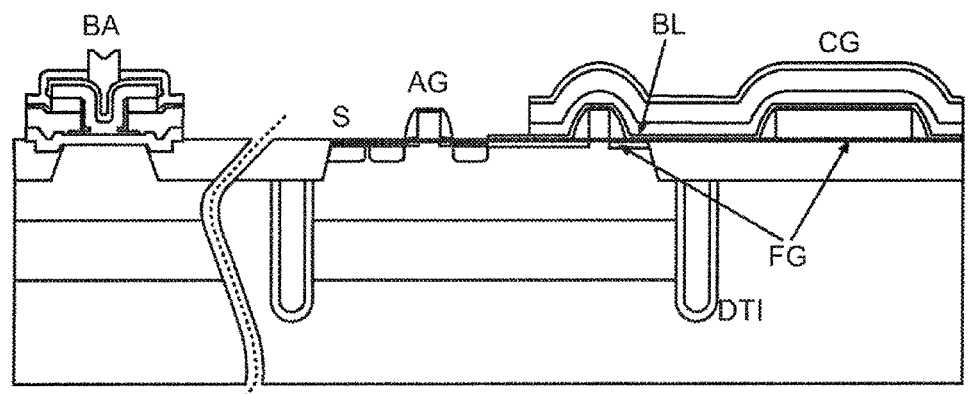
FIG. 1 shows a schematic cross section of part of an integrated circuit according to a first embodiment.

FIG. 1 shows a schematic cross section of part of an integrated circuit according to a first embodiment. Here, a many-times-programmable cell having a MOS transistor with a floating gate FG is depicted. The cell can comprises a source S, an access gate AG, a bil line BL and a control gate CG. The floating gate FG may comprise a tunnel oxide TO and is connected to a first low-leakage capacitor that may have a tunnel oxide TO as its dielectric material. However, it should be noted that any other low-leakage capacitor that is substantially larger than the gate-channel capacitance of the MOS and that has sufficient breakdown be sufficient.

It should be noted that an operation of many-time-programmable cells MTP is very similar to conventional non-volatile memory while the process complexity is much lower (only a single gate-poly is required) and the memory cell is bigger in size. Instead of retaining digital bits, the cell MTP is used according to the invention as a (semi-permanent) switch to connect or disconnect an analog component.

When a programming voltage e.g. 12V is applied to the cell, it will be divided across the first capacitor and gate-channel capacitance of the MOS proportional to the inverse capacitance value. The large ratio (e.g. more than 90%) between the capacitors ensures that a great part of the programming voltage will drop across the small capacitor with the tunnel oxide TO. Due to such a capacitive coupling mechanism a potential difference can be applied across the tunnel oxide TO up to the point where a Fowler-Nordheim tunneling current is induced. The charge that has tunneled through the tunnel oxide TO will remain trapped on the gate after the programming voltage has been reduced. Accordingly, the threshold voltage can be shifted from 2-3 V (or 5× threshold voltage) between "programmed" and "erased" state changing the MOS device from "normally off" to "normally on" and vice versa ("program" and "erase").

The thickness of the tunnel oxide TO is a trade-off between programming voltage and retention. As an example, the thickness can be 70 Å with a programming voltage around 12V. It should be noted that a thick oxide will require a high programming voltage while a too thin oxide will lead to a leaking away of the charge. Furthermore, the oxide should be thin enough to enable a direct tunneling to prevent a damaging of the tunnel oxide TO. Hence, a maximum thickness would be e.g. 100 Å. A damaging of the oxide would strongly reduce the number of read/write cycles (endurance). If a memory cell is used, an access gate is placed in series with the floating gate FG transistor to read out its state (on or off).

In the first embodiment a many-times-programmable cell is implemented as a switch. On the left side of FIG. 1 an example of a bipolar transistor is depicted and on the right side a cross section of a many-times-programmable cell is depicted. The fact that in a BiCMOS process an additional layer is present is exploited. The same poly layer that is used in the base connection in the bipolar area is used on top of CMOS gate, i.e. the floating gates. Hence, this gate can be used as a control gate. The floating gates FG can be pulled with the control gate. In addition or alternatively, the floating gates can be pulled by pulling the body. However, a pulling of the body will require a high voltage. Hence, a deep trench isolation DTI is provided to isolate the high voltages. Such a deep trench is a very compact way to isolate a junction while maintaining the capability of handling high voltages. By means of the silicon area between the two deep trenches a lot more freedom is present to manipulate the potential. In a process without the DTI, this would require a larger distance n-typ and p-typ areas or areas that need to be isolated.

If integrated circuit according to FIG. 1 is implemented based on BiCMOS a further poly layer can be present over the floating gates FG.

Figure 2:
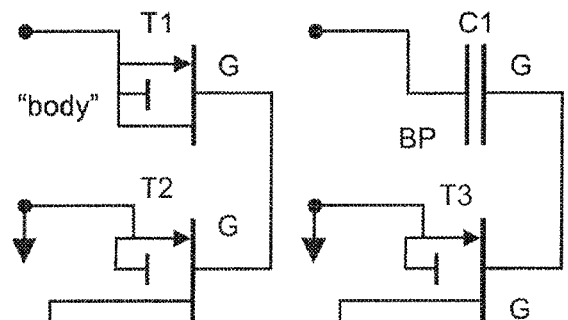
FIG. 2 shows a circuit diagram of a switching unit according to a second embodiment.

FIG. 2 shows a circuit diagram of a switching unit according to a second embodiment. On the left the conceptual CMOS implementation, and on the right a BiCMOS implementation is depicted. The CMOS implementation comprises a first and second transistor, wherein the gates G of the first and second transistor are coupled together. The source and drain of the first transistor are coupled together with the body terminal. The first transistor is implemented as the floating gate. The BiCMOS implementation enables a forming of the capacitor to the floating gate. Hence, the capacitor C1 is implemented between the gate G of the transistor T3 and a base poly BP. To enable a retention of charge the floating gate should be without contacts or any connection to interconnect. Therefore, capacitive coupling to the gate must be achieved with a layer in close proximity. In a CMOS implementation this can be achieved through a MOS gate as depicted on the left side of FIG. 2. A BiCMOS implementation enables some additional choices (i.e. base-poly) providing a more compact design while ensuring an improved retention.

When programmed, the MOS gate is switched "on" and the drain and source are semi-permanently connected (without the need of any additional signal or supply voltage). It should be noted that N-MOS implementations are also possible.

Figure 3:
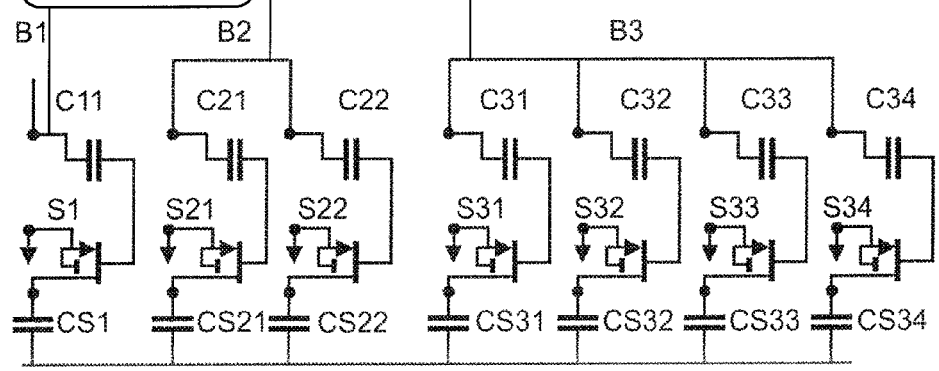
FIG. 3 shows circuit diagram of a trimming unit according to a second embodiment.

FIG. 3 shows circuit diagram of a trimming unit according to a second embodiment. Herein, the switches or switching units are grouped in "bits" where the $n^{th}$ bit B1-B3 contains 2n switches S1; S21, S22; S31, S32, S33; S34, wherein each switch is coupled to a first capacitor C11, C21, C22, C31, C32, C33, C34, respectively. A capacitor CS is connected to the drain, the source (and body) as well as to ground. The capacitor CS is chosen to be larger than the parasitic drain capacitance and small enough that Rl(closed switch)*$C_{total}$ is considerably less than $1/(Q\omega)$ wherein Q is the desired quality factor and $\omega$ is the angular frequency. It should be noted that $1/(Q\omega)$ I is independent of the number of switches that are used.

In the second embodiment, the switches S1, S21, S22, S31, S32, S33, and S34 may correspond to the many-times-programmable cell according to the first embodiment. The capacitors C1, C21, C22, C31, C32, C33, and C34 relate a MOS capacitor of FIG. 2. In FIG. 2 on the left side a MOS transistor is depicted where source and drain are shorted, i.e. a MOS capacitor is achieved. On the right side of FIG. 2 this is simplified to a capacitor.

The node which is coupled to the capacitors in FIG. 3 are used to pull the floating gate of the many-times-programmable cell.

According to the second embodiment a shunt capacitor (one end connected to ground) is provided that has several portions which are connected to ground and other portions connected to a high impedance for a "programmed" or "erased" switch. Accordingly, a capacitor is divided into a plurality of elements, wherein a switch is associated to each element. Such a capacitor can be used in an impedance matching network or an LC oscillator.

It should be noted that many different or derived embodiments may be possible by scaling of the capacitors and switches. In FIG. 3 merely the most basic implementation is depicted. The arrangement according to FIG. 3 may result in a linear relationship between the binary value and the capacitor value. Other arrangements leading to, for example, a quadratic or exponential relationship could also be useful in LC oscillators or trans-linear circuits, respectively. Arbitrary grouping of bits can be used without changing $1/(Q\omega)$ of the overall arrangement.

In the following a trade-off between switching ratio and RF performance is described. The switch will have some parasitic capacitance defining an open isolation and a finite conductance when it is closed. The combination of these parameters will lead to the upper limit for the frequency where such a switch is useful. This is fulfilled when a substantial contrast between the "open" and "closed" condition can be observed. The special requirements for RF operation will lead to some implications for the optimal layout and usage condition that differentiate this device from conventional MTP.

The parasitic influences are less pronounced when the switch is used in a "shunt" configuration closing a path to ground. In this configuration the source and body terminal are connected to ground, such that the parasitic capacitance (that is also to ground) can be neglected. In contrast; if the nodes on both ends of the switch would be "hot" the parasitics on both source and drain side should be considered. It should be noted that two switches in anti series can be used in differential mode: a special case that relates to a 180° phase difference between the signals on either end of this configuration.

Furthermore, if the floating gate does not ensure RF isolation, a large resistance (made from unsilicided/undoped poly) can be present between the large and small capacitor of the floating gate to isolate the large capacitor from the RF path. This does not impede programming because this is a relatively slow process involving low currents. Alternatively, a choke (large valued inductor) or ¼ lambda line could be used.

The parasitics of the MTP cell will be dominated by the drain of the MOS device that consists primarily of the junction capacitance between drain and body. When the switch is closed the channel will connect the source and the drain, such that the drain capacitance is shortened when the body and the source are connected to ground. The resistance is similar to that of an MOS transistor in the linear regime. This resistance is then given by: $L/W (V_{gs}-V_t)/\beta$. An overview of values is given in Table 1.

TABLE 1

|  | Drain capacitance | | | | Channel resistance of programmed gate (at 2.1 V) | | | |
| --- | --- | --- | --- | --- | --- | --- | --- | --- |
|  | Cdrain fF/μm² | Wdrain μm | Cedge fF/μm | C fF/μm | β μA/V² | β (7.5 nm) μA/V² | Rch kΩsq. | Rch(L = 0.15) kΩμm |
| PMOS | 0.77 | 0.45 | 0.10 | 0.45 | 57.00 | 38.00 | 55.26 | 8.29 |
| NMOS | 0.87 | 0.45 | 0.10 | 0.49 | 236.00 | 157.33 | 13.35 | 2.00 |

From the table it is clear that the NMOS device has a much lower channel resistance this is can be explained by the higher mobility of electrons compared to holes.

The ratio of on- and off-admittance is an indication of the effect of the switch.

At low frequency, the open switch behaves as a capacitor with an admittance of: $Y_{open}=jwC$ with $w=2\pi f$ and C being the capacitance value. For a closed switch, the channel resistance is in parallel to this capacitor, changing the admittance to $Y_{closed}=jwC+1/Rch$. The ratio between open and closed state is: $jwRchC/(1+jwRchC)$. For frequencies above $½\pi RchC$ the ratio between "open" and "closed" admittance quickly approaches one. Therefore, the time constant $\tau=RchC$ indicates the useful frequency range of the switch. Table 2 gives a calculation of a single-stripe MOS device.

TABLE 2

|  | transit ps | Cutoff GHz |
| --- | --- | --- |
| PMOS | 3.70 | 43 |
| NMOS | 0.98 | 162 |

The layout of the MTP cell can be further optimized by connecting a longer gate perimeter around a small drain area in a donut shape. If two contacts and minimum design rules are used, the results will correspond to the results as depicted in Table 3.

TABLE 3

| Drain area: 0.75 × 1.25 two contacts | | | | |
| --- | --- | --- | --- | --- |
|  | C fF | R kΩ | transit ps | Cutoff GHz |
| PMOS | 0.72 | 2.07 | 1.50 | 106 |
| NMOS | 0.81 | 0.50 | 0.41 | 392 |

If many switches are used in parallel e.g. to achieve sufficiently high admittance a single contact per drain area can be used yielding an even better performance: as depicted in Table 4. It should be noted that single contacts in a single switch is not recommended in the light of manufacturability.

TABLE 4

| Drain area: 0.75 × 0.75 one contact | | | | |
| --- | --- | --- | --- | --- |
|  | C fF | R kΩ | transit ps | Cutoff GHz |
| PMOS | 0.43 | 2.76 | 1.20 | 133 |
| NMOS | 0.49 | 0.67 | 0.32 | 490 |

A preferred MTP cell could be implemented as a single-contact NMOS with a cut-off frequency of around 490 GHz. Such a device can be achieved in 0.25 μm technology, such that the concept according to the invention is applicable to realistic frequencies and realistic technology choices. The cut-off will be higher for more advanced technologies. Even at 100 GHz a switching ratio of 4.9 could be achieved. In addition, operating frequencies around a few GHz, most typical for microwave circuits, admittance ratios ~100 can be reached. It should be noted that multiple switches in parallel or anti series does not change the ratio between open and closed admittance.

In the embodiments of the invention the analog components or units can be reactive components which are connected to the switching units according to the invention due to the fact that these will not affect the RF losses. The resistance of the switching units in both states will put an upper limit on the Q factor that the reactive component can have.

According to an embodiment of the invention, a series capacitor is coupled to the switching unit with a ratio of Cseries=α*Cdrain. The ratio between observed capacitance in the open and closed state (the switch ratio) is: Cop/Cclosed=1/(α+1). Hence, the series capacitor must be increased to increase the difference between the open and closed state of the switching unit. Furthermore, the observed capacitance in the open state is approximately equal to the drain capacitance. However, the Q factor of the observed capacitance in the closed state is: f*Qclosed/Cutoff=1/α. Accordingly, increasing α will increase the switch ratio, but it will decrease Qclosed proportionally. The series capacitor should therefore be scaled appropriately to reach the desired trade-off between Q factor and switch ratio. A special point is α=1 where a switching ratio of 2 is achieved while not deteriorating the cut-off of the switch.

To trim a specific capacitor only a fraction or part of the capacitance is connected to a switch by dividing the main capacitor into multiple smaller ones. For example, to increase the accuracy of a MIM capacitor from +−5% to +−0.04% after trimming, a MIM capacitor with C=0.95*Ctarget could be placed after place 128 switches, grouped in 8 "bits", with a capacitance of C=(0.1*Ctarget)/128 per switch in parallel.

If the parallel capacitor is larger and has a large Q, we increase the overall Q proportional to the relative increase of the overall capacitance:

$$Q_{tot} = \frac{(C_1+C_2)Q_{C1}Q_{C2}}{C_1Q_{C2}+C_2Q_{C1}} \underset{limQ_{c2}\to\infty}{=} \frac{(C_1+C_2)}{C_1}Q_{C1} \quad (1)$$

Therefore, the trimmable fraction of the capacitor, if small enough, does not necessarily need to have an extremely high Q factor. Furthermore, switching equal capacitors in parallel will not change the overall Q factor. Therefore, multiple switches can be used in parallel. In the above MIM example the overall Q factor would be 9.5× the Q factor of the switching unit and the capacitor.

The minimum capacitance per switch determines the resolution of the trimming, with α=1 the resolution is equal to Cdrain; ~0.5 fF. With an increased α the quality factor increases whereas the resolution decreases proportionally. However, a resolution of a few fF is substantially smaller than process variation that are encountered in typical products (i.e. a 1 pF capacitor with ~a few percent accuracy is typical).

Figure 4:
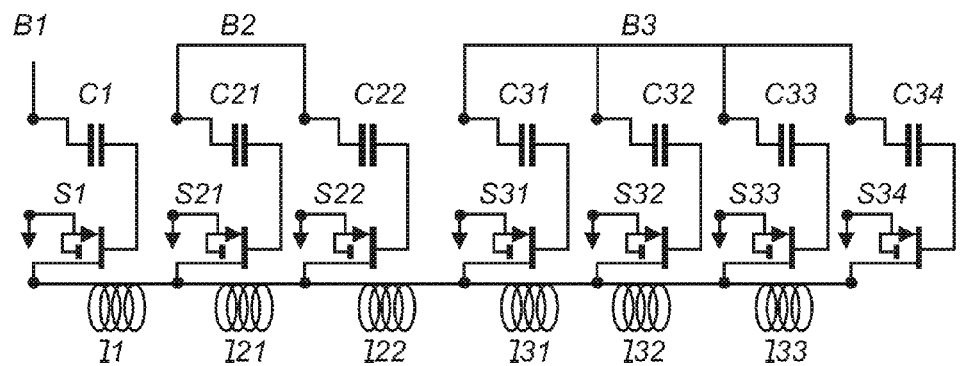
FIG. 4 shows circuit diagram of a trimming unit and an inductor unit according to a third embodiment.

FIG. 4 shows a circuit diagram of a trimming unit and an inductor unit according to a third embodiment. Here, a trimmable series inductor is depicted. Switches or switching units are grouped in "bits" where the $n^{th}$ bit B1-B3 contains 2n switches S1; S21; S22; S31, S32, S33; S34, wherein each switch is coupled to a first capacitor C11, C21, C22, C31, C32, C33, C34, respectively. Each switching group is coupled to an inductor element, i.e. the switching group B1 is coupled to an inductor element I1, the switching group B2 is coupled to two inductor elements I21, I22 while the switching group B3 is coupled to the inductor elements I31, I32, I33, I34. In other words the numbers of inductor elements correspond to the number of switches.

Hence, the switching units can be used for connecting an inductive component in series. The drain capacitance of the switching units can lead to a resonance thus limiting the maximum operating frequency for a given resistance in the closed state. To achieve partial trimming of an inductor value the switching unit can also connect it to a secondary winding. When the switch is closed; the secondary winding is shorted and the overall inductance is reduced. Although possible, this is not the most likely usage condition as uncertainty is usually greatest in parasitic capacitance that is governed by layer thicknesses that usually can be controlled within a few percent.

In a further embodiment which can be based on any of the embodiments of the invention switched capacitors and/or switched inductors can also be embedded in a waveguide structure. Accordingly, the impedance and/or the propagation speed of the waveguide can be trimmed. Here, a trade-off in the amount of trimming (e.g. amount of phase shift) and the transmission line losses must be performed.

Especially the arrangement of switched capacitors that are embedded (placed in a shunt configuration) in a transmission line is very attractive to calibrate time delay. This is very useful in basic building blocks such as: phased-array antennas, hybrids, oscillators filters, impedance matching etc.

Figure 5:
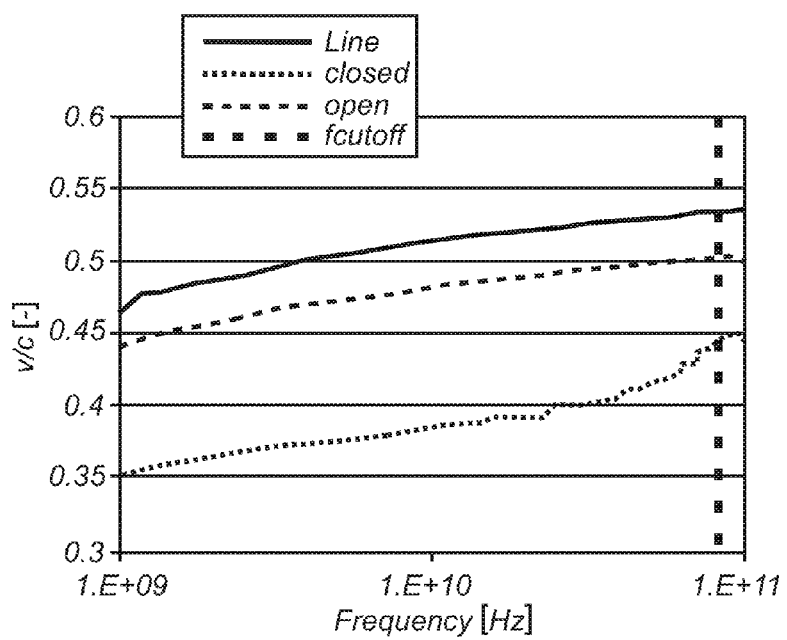
FIG. 5 shows a graph depicting a propagation speed versus the speed of light according to a fourth embodiment.

FIG. 5 shows a graph depicting a propagation speed versus the speed of light according to a fourth embodiment. Here, calculations on measured data of a 60Ω transmission line are depicted. The admittance of an open and closed switch is calculated from process parameters. A capacitor with 5× the drain capacitance value of the switch is put between the switch and the (signal) line. 351 switches/cm are used to change the total line admittance about 80% between the open and closed state of the switch. It should be noted that the various parameters can be varied to optimize bandwidth vs. loss vs. phase shift.

Figure 6:
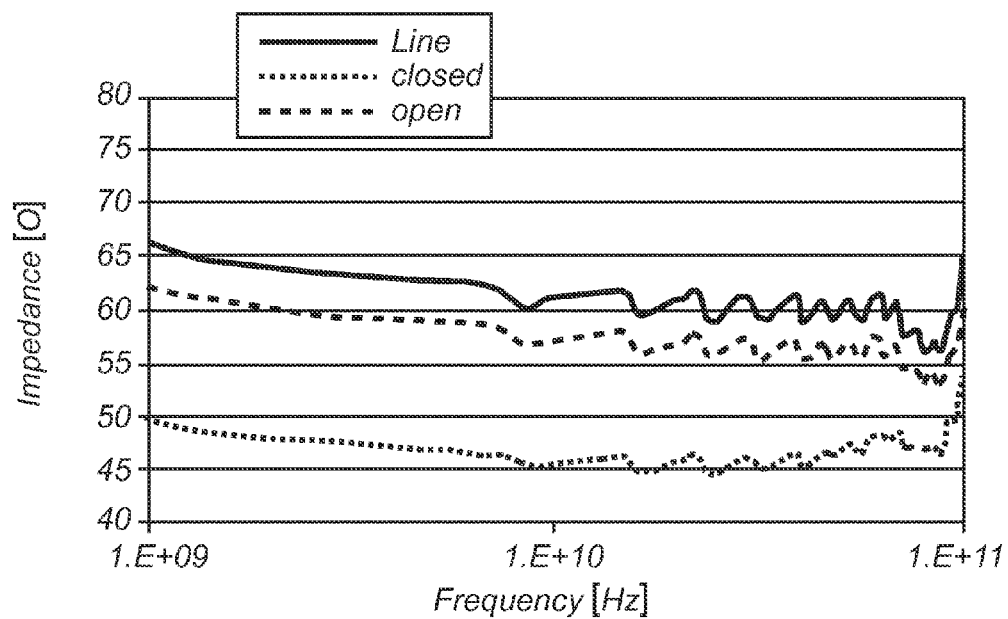
FIG. 6 shows a graph depicting an impedance of a loaded line according to FIG. 5.
Figure 7:
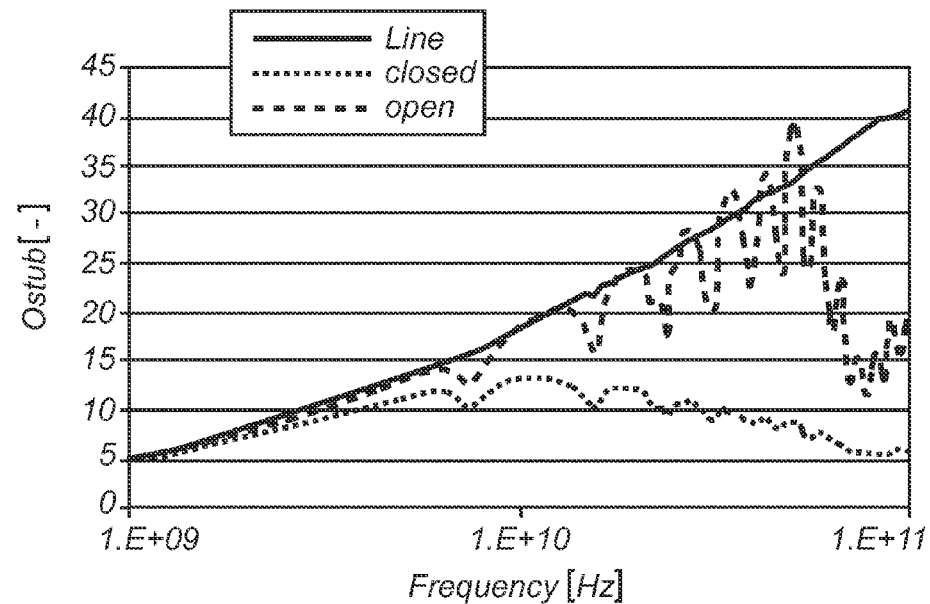
FIG. 7 shows a graph depicting a Q factor of a shorted stub versus a frequency for lines according to FIG. 5.

FIG. 6 shows a graph depicting an impedance of a loaded line according to FIG. 5; and FIG. 7 shows a graph depicting a Q factor of a shorted stub versus frequency for lines according to FIG. 5. Accordingly, a considerable change in propagation speed (about 20%) can be achieved while maintaining a reasonable quality factor (Qstub=Im(γ)/Re(γ)) around 10 with all the switches closed. This quality factor can be traded for degree of phase shift by opening some switches or change the configuration.

The principles of the present invention can be applied to any circuit that requires accurate trimming of capacitors, inductors, time delay and the like wherein calibration information is to be retained while the circuit is switched off. The invention is highly relevant for integrated circuits where parametric control of passive components dominates the yield. It is especially attractive in very high frequency circuits (e.g. W-Band car radar, 60 GHz wireless networking, Ka/Ku band satellite downlink, 5.8 GHz cordless) where accuracy becomes critical. Once programmed, no power is needed to maintain the calibrated state; hence application in very low power radios is attractive. The invention can even be used with passive integration provided that a suitable tunnel-oxide is present.

The invention relates to the idea to implement a non-volatile memory in a BiCMOS process. Here, layers which are already present for a bipolar transistor can be re-used for the memory. Accordingly the memory cells can be shielded from stray charges etc, i.e. an improved shielding can be provided. Furthermore, a control gate can be provided, i.e. a capacitor with a capacitive coupling between the floating gate and a controllable terminal. Accordingly the potential of the floating gate can be pulled without a galvanic coupling. Moreover, with the additional layer of a greater thickness the gate area of the floating gate poly can be reduced.

The invention relates to the idea to provide a small digital non-volatile memory with a register for programming voltages or for maintaining control voltages. Moreover, a non-volatile memory can be used as a switch. Such a switch can be isolated very well from all the other circuitry thus preventing cross-talk. No voltage across the switch is required once the switch has been set or reset.

According to an embodiment of the invention the first capacitor is implemented by stacking a poly layer on top of the gate. In addition or alternatively a MOS capacitor can be used. This capacitor can be implemented in a separate island as depicted in FIG. 1.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

Furthermore, any reference signs in the claims shall not be constrained as limiting the scope of the claims.

The invention claimed is:

1. Integrated circuit, comprising:
at least one first group each having at least one analog circuit;
at least one second group each having at least one electronically settable semi-permanent switching circuit coupled to the at least one analog circuit of the first group for trimming the first group and having at least one many-times-programmable and non-volatile cell;
wherein each many-times-programmable cell comprises at least one MOS transistor connected in series with one of the analog circuits and having a source and drain in parallel with a source and drain of at least another MOS transistor in another one of the many-times-programmable cells, and having a floating gate with a tunnel oxide and a first capacitor coupled to the floating gate; and
wherein the capacitance of the first capacitor is substantially larger than a gate-channel capacitance of the MOS transistor;
wherein the at least one analog circuit comprises at least one of a capacitor, an inductor, and a time delay unit, and
wherein the at least on electronically settable semi-permanent switching circuit includes a plurality of switching circuits that are grouped in bits, where the nth bit contains 2n many-times-programmable cells, where n is a positive integer.

2. Integrated circuit according to claim 1, wherein the first capacitor comprises a tunnel oxide as dielectric material, wherein a tunneling current is induced when a programming voltage across the many-times-programmable cell is sufficiently high and wherein a charge which has tunneled remains trapped when the programming voltage is reduced,
wherein the first capacitor is configured and arranged to set a potential of the floating gate to provide non-volatile charge storage in the floating gate, and wherein the at least one electronically settable semi-permanent switching circuit is configured and arranged to retain a position by storing electric charge on the floating gates that is independent of a voltage supply being present.

3. Integrated circuit according to claim 1, wherein the integrated circuit is a CMOS implementation and the first capacitor is implemented as a transistor with its gate coupled to the floating gate.

4. Integrated circuit according to claim 1, wherein the integrated circuit is a BiCMOS implementation and the first capacitor is implemented as a capacitor coupled between the floating gate and a base poly layer.

5. Integrated circuit according to claim 1, wherein a thickness of the tunnel oxide is from 50-100 Å, and wherein the at least one MOS transistor has a programming voltage of about 12V.

6. Integrated circuit according to claim 1, further including at least one of a phased-array antenna, an oscillator, a filter, and a matching device and wherein the at least on electronically settable semi-permanent switching circuit is configured and arranged retain a position by storing the electric charge on the respective floating gates for a duration of at least ten years and wherein the trimming is reversible for re-calibration.

7. Integrated circuit according to claim 1, wherein each of the at least one analog circuits is a second capacitor connected directly to ground, the at least one MOS transistor being connected directly to the second capacitor and configured and arranged to trim the second capacitor based upon data stored in the non-volatile cell.

8. The integrated circuit of claim 1, wherein
the first capacitor is configured and arranged to provide a voltage division between the first capacitor and a second capacitor including the floating gate and a channel of the MOS transistor as separated by the tunnel oxide, according to a capacitance ratio of the first and second capacitors and
the first and second capacitors are configured and arranged to provide a voltage drop and to apply the voltage drop to the tunnel oxide.

9. The integrated circuit of claim 1, wherein the electrically settable semi-permanent switching circuit is configured and arranged to electrically set the switch by:
measuring a threshold voltage of the floating gate; and
programming the switching circuit by applying a programming voltage to the floating gate.

10. An apparatus comprising:
an analog circuit; and
a plurality of electrically settable semi-permanent switching circuits communicatively coupled to the analog unit and configured and arranged to trim the analog circuit in an electrical domain each switching circuit including a many-times-programmable non-volatile memory circuit having
a first capacitor, and
at least one MOS transistor including a source and drain in parallel with a source and drain of the at least one MOS transistor of another one of the electrically settable semi-permanent switching circuits, a channel, a floating gate and a tunnel oxide, the floating gate being coupled to the first capacitor, the first capacitor being configured and arranged with a capacitance substantially larger than a gate-channel capacitance of the MOS transistor,
wherein the first capacitor is configured and arranged to set the potential of the floating gate to provide non-volatile charge storage in the floating gate and wherein the plurality of electrically settable semi-permanent switching circuits are configured and arranged to retain a position by storing electric charge on the floating gates that is independent of a voltage supply;

wherein the electrically settable semi-permanent switching circuit is configured and arranged to electrically set the switch by:

measuring a threshold voltage of the floating gate;

programming the switching circuit by applying a programming voltage to the floating gate; and wherein the plurality of electronically settable semi-permanent switching circuits are grouped in bits, where the nth bit contains 2n many-times-programmable cells, where n is a positive integer.

11. The apparatus of claim 10 wherein the electrically settable semi-permanent switching circuit is further configured and arranged to reversibly trim the analog circuit in an electrical domain, utilizing at least one of the many-times-programmable non-volatile memory circuits.

12. The apparatus of claim 10, wherein the electrically settable semi-permanent switching circuit is configured and arranged to trim the analog circuit by selectively coupling the analog circuit to at least one other analog circuit via at least one of the switching circuits, based upon a charge on the floating gate of the at least one of the switching circuits.

13. The apparatus of claim 10, wherein each MOS transistor is connected to another analog circuit and the apparatus is configured and arranged to trim the analog circuit by connecting the analog circuit to at least one of the other analog circuits by controlling the floating gate of at least one of the MOS transistors.

14. The apparatus of claim 13, wherein each of the other analog circuits is a capacitor and the apparatus is configured and arranged to trim a capacitance of the analog circuit by controlling the plurality of switching circuits to connect the analog circuit to at least one of the capacitors.

15. The apparatus of claim 13, wherein each of the other analog circuits is an inductor and the apparatus is configured and arranged to trim an inductance of the analog circuit by controlling the plurality of switching circuits to connect the analog circuit to at least one of the inductors in series.

16. The apparatus of claim 10, wherein the first capacitor is configured and arranged provide a voltage division between the first capacitor and a second capacitor that includes the floating gate and a channel of the at least one MOS transistor as separated by the tunnel oxide, according to a capacitance ratio of the first and second capacitors, and the first and second capacitors are configured and arranged to provide a voltage drop and to apply the voltage drop to the tunnel oxide.

* * * * *